United States Patent
Sezginer et al.

(10) Patent No.: US 11,131,629 B2
(45) Date of Patent: Sep. 28, 2021

(54) APPARATUS AND METHODS FOR MEASURING PHASE AND AMPLITUDE OF LIGHT THROUGH A LAYER

(71) Applicant: KLA-Tencor Corporation, Milpitas, CA (US)

(72) Inventors: Abdurrahman Sezginer, Monte Sereno, CA (US); Kuljit Virk, Fremont, CA (US); Eric Vella, Mountain View, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 202 days.

(21) Appl. No.: 15/882,951

(22) Filed: Jan. 29, 2018

(65) Prior Publication Data

US 2018/0340886 A1 Nov. 29, 2018

Related U.S. Application Data

(60) Provisional application No. 62/511,444, filed on May 26, 2017.

(51) Int. Cl.
| | |
|---|---|
| *G01N 21/41* | (2006.01) |
| *G01N 21/956* | (2006.01) |
| *G01J 1/44* | (2006.01) |
| *G01J 9/00* | (2006.01) |
| *G01N 21/55* | (2014.01) |
| *G03F 1/84* | (2012.01) |
| *G03F 1/32* | (2012.01) |

(52) U.S. Cl.
CPC .............. *G01N 21/41* (2013.01); *G01J 1/44* (2013.01); *G01J 9/00* (2013.01); *G01N 21/55* (2013.01); *G01N 21/95607* (2013.01); *G03F 1/32* (2013.01); *G03F 1/84* (2013.01); *G01N 2021/95676* (2013.01)

(58) Field of Classification Search
None
See application file for complete search history.

(56) References Cited

U.S. PATENT DOCUMENTS

| | | | | |
|---|---|---|---|---|
| 5,420,417 | A * | 5/1995 | Shiraishi | G03F 7/70108 |
| | | | | 250/205 |
| 5,429,897 | A | 7/1995 | Yoshioka et al. | |
| 5,576,829 | A * | 11/1996 | Shiraishi | G01N 21/88 |
| | | | | 356/432 |
| 6,239,878 | B1 * | 5/2001 | Goldberg | G03F 7/70258 |
| | | | | 356/508 |

(Continued)

OTHER PUBLICATIONS

International Search Report PCT International Application No. PCT/US2018/034521, filed on May 25, 2018, dated Sep. 19, 2018.

(Continued)

*Primary Examiner* — Kara E. Geisel
(74) *Attorney, Agent, or Firm* — Kwan & Olynick LLP

(57) ABSTRACT

In one embodiment, disclosed are apparatus, methods, and targets for determining a phase shift of a photomask having a phase-shift target. An inspection or metrology system is used to direct an incident beam towards the target and then detect a plurality of intensity measurements that are transmitted through the target in response to the incident beam. A phase shift value for the target may then be determined based on the intensity measurements.

24 Claims, 7 Drawing Sheets

(56) References Cited

U.S. PATENT DOCUMENTS

| | | | |
|---|---|---|---|
| 7,081,956 B1* | 7/2006 | Lalovic | G03F 7/70091 356/400 |
| 7,179,570 B2* | 2/2007 | Sivakumar | G03F 1/34 430/5 |
| 7,643,157 B2 | 1/2010 | Takizawa et al. | |
| 9,544,558 B2* | 1/2017 | Tada | H04N 9/3191 |
| 2002/0131052 A1* | 9/2002 | Emery | G03F 1/72 356/511 |
| 2005/0007602 A1* | 1/2005 | Haidner | G01J 9/04 356/521 |
| 2005/0089763 A1 | 4/2005 | Tan et al. | |
| 2005/0238965 A1* | 10/2005 | Tyrrell | G03F 1/50 430/5 |
| 2006/0114437 A1* | 6/2006 | Akhssay | G03F 7/70258 355/55 |
| 2007/0121090 A1* | 5/2007 | Chen | G03F 7/705 355/67 |
| 2008/0116402 A1* | 5/2008 | Emer | G03F 7/70941 250/574 |
| 2011/0193956 A1* | 8/2011 | Gilg | H04N 5/2355 348/135 |
| 2011/0242544 A1* | 10/2011 | Stroessner | G03F 7/70141 356/496 |
| 2012/0075456 A1* | 3/2012 | Seitz | G01B 11/02 348/79 |
| 2013/0122403 A1* | 5/2013 | Kim | G03F 1/32 430/5 |
| 2013/0130182 A1* | 5/2013 | Markle | G03B 27/522 430/322 |
| 2015/0198541 A1* | 7/2015 | Trautzsch | G06T 7/0004 382/144 |
| 2015/0276617 A1* | 10/2015 | Hess | G01N 21/95607 356/215 |
| 2016/0223920 A1* | 8/2016 | Tinnemans | G01B 11/272 |

OTHER PUBLICATIONS

Written Opinion for PCT International Application No. PCT/US2018/034521, filed on May 25, 2018, dated Sep. 19, 2018.

Sipe, J.E., "New Green-function formalism for surface optics", Sipe, J. E. (1987). New Green-function formalism for surface optics. Journal of the Optical Society of America B, 4(4), 481. doi:10.1364/josab.4.000481, Apr. 1987, 9 pages.

Wang, Zhuo et al., "Spatial Light Interference Microscopy (SLIM)", Zhuo Wang, Larry Millet, Mustafa Mir, Huafeng Ding, Sakulsuk Unarunotai, John Rogers, Martha U. Gillette, and Gabriel Popescu, "Spatial light interference microscopy (SLIM)," Opt. Express 19, 1016-1026 (2011), Jan. 17, 2011, 11 Pages.

Supplemental European Search Report, Application No. EP18806454, dated Dec. 14, 2020, 6 pages.

* cited by examiner

APPARATUS AND METHODS FOR MEASURING PHASE AND AMPLITUDE OF LIGHT THROUGH A LAYER

CROSS-REFERENCE TO RELATED APPLICATIONS

This application claims the benefit of prior application U.S. Provisional Application No. 62/511,444, filed 26 May 2017 by Abdurrahman (Apo) Sezginer et al., which application is herein incorporated by reference in its entirety for all purposes.

TECHNICAL FIELD OF THE INVENTION

The present invention relates generally to methods and systems for measuring semiconductor reticles or the like and, more specifically, measuring phase and amplitude of light transmitted through such reticles.

BACKGROUND

Photolithography systems used in the manufacture of integrated circuits have been around for some time. Such systems have proven extremely effective in the precise manufacturing and formation of very small details in the circuit product. In some photolithography systems, a circuit image is written on a substrate by transferring a pattern via a light or radiation beam (e.g., UV or ultraviolet light). For example, the lithography system may include a light or radiation source that projects a circuit image through a patterned reticle and onto a silicon wafer coated with a material sensitive to irradiation, e.g., photoresist. The exposed photoresist typically forms a pattern that after development masks the layers of the wafer during a subsequent etch process.

Due to the large scale of circuit integration and the decreasing size of semiconductor devices, the reticles and fabricated devices have become increasingly sensitive to structure and process variations. These variations, if uncorrected, can adversely affect yield.

Numerous techniques have been developed to measure various characteristics of semiconductor samples so as to improve yield. However, there is a continued need for improved targets, apparatus, and techniques for measuring characteristics of semiconductor samples.

SUMMARY OF THE INVENTION

The following presents a simplified summary of the disclosure in order to provide a basic understanding of certain embodiments of the invention. This summary is not an extensive overview of the disclosure and it does not identify key/critical elements of the invention or delineate the scope of the invention. This summary's sole purpose is to present some concepts disclosed herein in a simplified form as a prelude to the more detailed description that is presented later.

In one embodiment, a method of determining a phase shift of a photomask having a phase-shift target is disclosed. An inspection or metrology system is used to direct an incident beam towards the target and then detect a plurality of intensity measurements that are transmitted through the target in response to the incident beam. A phase shift value for the target may then be determined based on the intensity measurements.

In a specific implementation, the target comprises a first portion formed from a phase-shifting layer deposited over a substrate and a second portion from which the phase shifting layer is removed, and the first and second portions each have a size for completely filling the illumination field of the incident beam. In a further aspect, the target further comprises a third portion comprised of one or more gratings etched in the phase-shifting layer and the intensity measurements are also obtained for each imaged diffraction order. In one aspect, the third portion comprises two or more gratings. In an alternative aspect, the one or more grating are each formed from a plurality of lines etched from the phase-shifting layer. In another embodiment, the one or more grating are formed from a two dimensional array of holes or pillars etched from the phase-shifting layer.

In another embodiment, a plurality of reflected intensity values that are reflected from the target in response to the incident beam are measured, and the phase shift value is further based on the reflected intensity values. In one aspect, the measured intensity values are obtained from a pupil image using a Bertrand lens. In another embodiment, the operations for directing and detecting are performed by a reticle inspection system. In a further aspect, the inspection system comprises an objective from which the measured intensity values are obtained from a pupil image of the objective. In another aspect, the objective is a reflective or refractive element. In an alternative implementation, the phase shift is determined by adjusting a plurality of parameters of a model for calculating intensity values until a difference between such calculated intensity values and the measured intensity values is minimized and then the model is used to determine the phase shift based on final values for the model parameters.

In an alternative embodiment, the invention pertains to a system for determining a phase shift of a photomask having a phase-shift target. The system includes Illumination optics for directing an incident beam towards the target and collection optics for measuring a plurality of intensity values that are transmitted through the target in response to the incident beam. The system also includes a controller configured to determine and store a phase shift value for the target based on the intensity measurements. The controller is further configured to perform one or more of the above-described method operations. Certain embodiments of the invention also pertain to specific targets as described herein.

These and other features of the present invention will be presented in more detail in the following specification of embodiments of the invention and the accompanying figures which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

A photomask generally includes a transparent substrate, such as glass, borosilicate glass, quartz, or fused silica having a layer of opaque material formed thereon. In one general type, opaque (or substantially opaque) material may include any suitable material that blocks photolithographic light (e.g., deep or extreme UV). Example materials include chrome, molybdenum silicide (MoSi), tantalum silicide, tungsten silicide, opaque MoSi on glass (OMOG), etc. A polysilicon film may also be added between the opaque layer and transparent substrate to improve adhesion. A low reflective film, such as molybdenum oxide ($MoO_2$), tungsten oxide ($WO_2$), titanium oxide ($TiO_2$), or chromium oxide ($CrO_2$) may be formed over the opaque material.

A binary mask generally includes opaque and transparent portions that are arranged to expose patterns within a photoresist material on a wafer, and the unexposed patterns are then further processed (e.g., etched) to form patterns in an underlying film on the wafer. However, binary masks have resolution limits, for example, for line-space features, because opaque features tend to become less opaque as they shrink. As feature sizes continue to be reduced, a phase-shift mask (PSM) provides enhanced contrast for printing smaller and smaller features, such as line-space features, through use of interference effects.

A PSM may include selected phase-shifting regions that are designed to alter the phase of the impinging radiation, as compared to other non-phase-altering mask regions, in such a way as to result in more features being formed on the wafer than would be formed by a binary mask with only transparent-opaque mask regions. The phase differences of the different PSM regions are generally designed to result in constructive interference. For instance, the PSM regions may be formed from a partially transmissive material (MoSi) adjusted to have 6% transmissive intensity and 180 degrees of phase shift. Other PSM regions may have partially transmissive properties in the range of 6%-24% transmissivity, by way of example.

Figure 1:
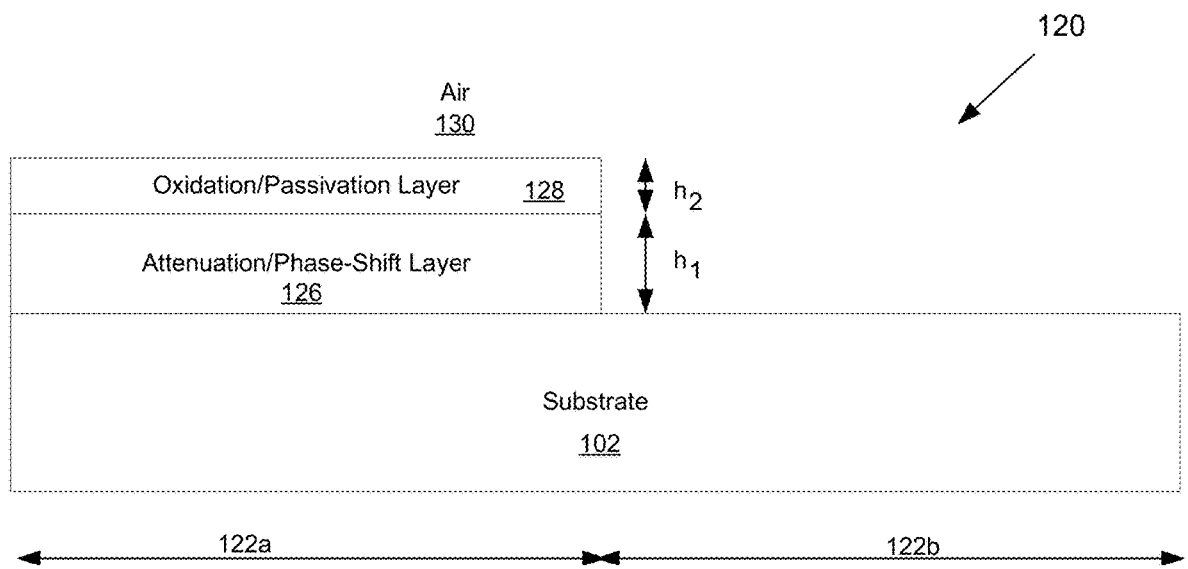
FIG. 1 is a diagrammatic side view of a phase-shifting portion and transparent portion of an embedded PSM.

One type of phase-shifting (or halftone) material that is applied to arbitrary layout patterns is referred to as an attenuated or halftone PSM or also called an embedded phase shift mask (EPSM), which is fabricated with partially transmissive or "halftone" features, instead of opaque features. An example of an EPSM portion 120 is shown in FIG. 1, which includes a phase-shifting portion 122*a* and transparent portion 122*b*.

The phase-shifting portion 122*a* can be composed of a stack of films (layers), including one or more phase-shifting materials, deposited on each other. For example, the phase-shifting portion 122*a* may be comprised of a film stack formed over a substrate 102, and such film stack may include an attenuating phase-shift layer 126, such as molybdenum silicide (MoSi) and a thin oxidation or passivation layer 128, such as $SiO_2$, resulting from oxidation of the phase-shift layer 126, or which is deposited intentionally as a passivation layer. $SiO_2$ is one example of an oxidation or passivation layer. The surface of the phase-shifting portion 122*a* may be covered by another compound or it may be roughened. Other film stacks are possible. For example, the MoSi layer could be replaced by multiple layers providing desired values of attenuation and phase shift. The non-phase-shifting target portion 122*b* may comprise any suitable material, such as bare silica substrate.

Figure 2:
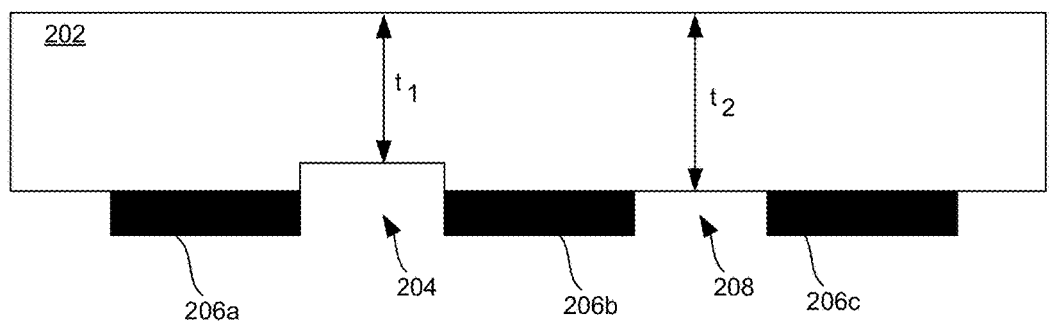
FIG. 2 is a diagrammatic side view of an alternating PSM.

An alternating PSM, an ALT PSM, or a Levenson PSM utilizes a different phase-shifting approach, which includes different thicknesses for different portions of a transparent substrate, which will result in different phase shifts. FIG. 2 is a diagrammatic side view of an alternating PSM having a transparent substrate 202 with a phase-shifting region 204 and a plurality of opaque portions 206*a*, 206*b*, and 206*c*. The alternating PSM also includes bare substrate portions, e.g., 208. In another embodiment, the PSM may include phase shifting film stacks that are capped by opaque material.

As shown, the phase-shifting region 204 has a recess shape and smaller thickness $t_1$ than the thickness $t_2$ of the bare substrate portion 208. Alternatively, the phase shifting region may have a larger thickness (e.g., plateau shape) than the other substrate portions. An alternating PSM may alternatively be comprised of only varying substrate thicknesses, including recesses and/or plateaus, without opaque or partially transmissive portions being formed thereon.

There are various ways to inspect PSM's for defects or to measure characteristics that may adversely affect yield in the fabricated devices. In one test case, the amplitude and phase of light that is transmitted through various phase shifting portions of a PSM may be obtained and assessed for quality control purposes. In one measurement approach, an interferometer tool is used to measure phase. However, this technique requires a separate interferometer tool and test cycle time, in addition to the mask inspection tool and its associated mask inspection time.

Certain embodiments of the present invention utilize specialized phase-shift targets on a PSM and a mask inspection tool to determine phase values for such phase-shift targets and the PSM. Such metrology targets are designed for measurement of transmission of electromagnetic waveform characteristics, such as phase and amplitude, through one or more phase-shift layers of the mask. Several targets may be placed on the mask. In an embodiment, targets are placed outside the pellicle frame on the mask, where more area is available.

In general, electromagnetic radiation (or light) that is transmitted by one of these photomask targets may be collected by collection optics. The radiation intensity at the pupil of the collection optics may then be recorded by a sensor, such as a CCD or CMOS sensor array, and such intensity may be used to determine phase shift as further described below.

The amplitude of transmission (T) through one layer can be determined by the ratio of the intensities measured over two parts of the mask with the layer present and removed:

$$|T| = \frac{\text{Intensity(layer present)}}{\text{Intensity(layer removed)}} \qquad \text{Equation\_1}$$

In a first embodiment, each target has two parts: an area where a phase-shift layer is removed and an area where the phase-shift layer is intact. For example, the target may include target portion 122a and 122b as illustrated in FIG. 1. The size of each target region may be large enough to completely fill the field illuminating the mask for this embodiment. For example, the extent of each part may be 200 µm×200 µm. The mask may be illuminated by substantially monochromatic light. In a specific implementation, the fractional bandwidth of illumination is, for example, smaller than one percent.

Figure 3A:
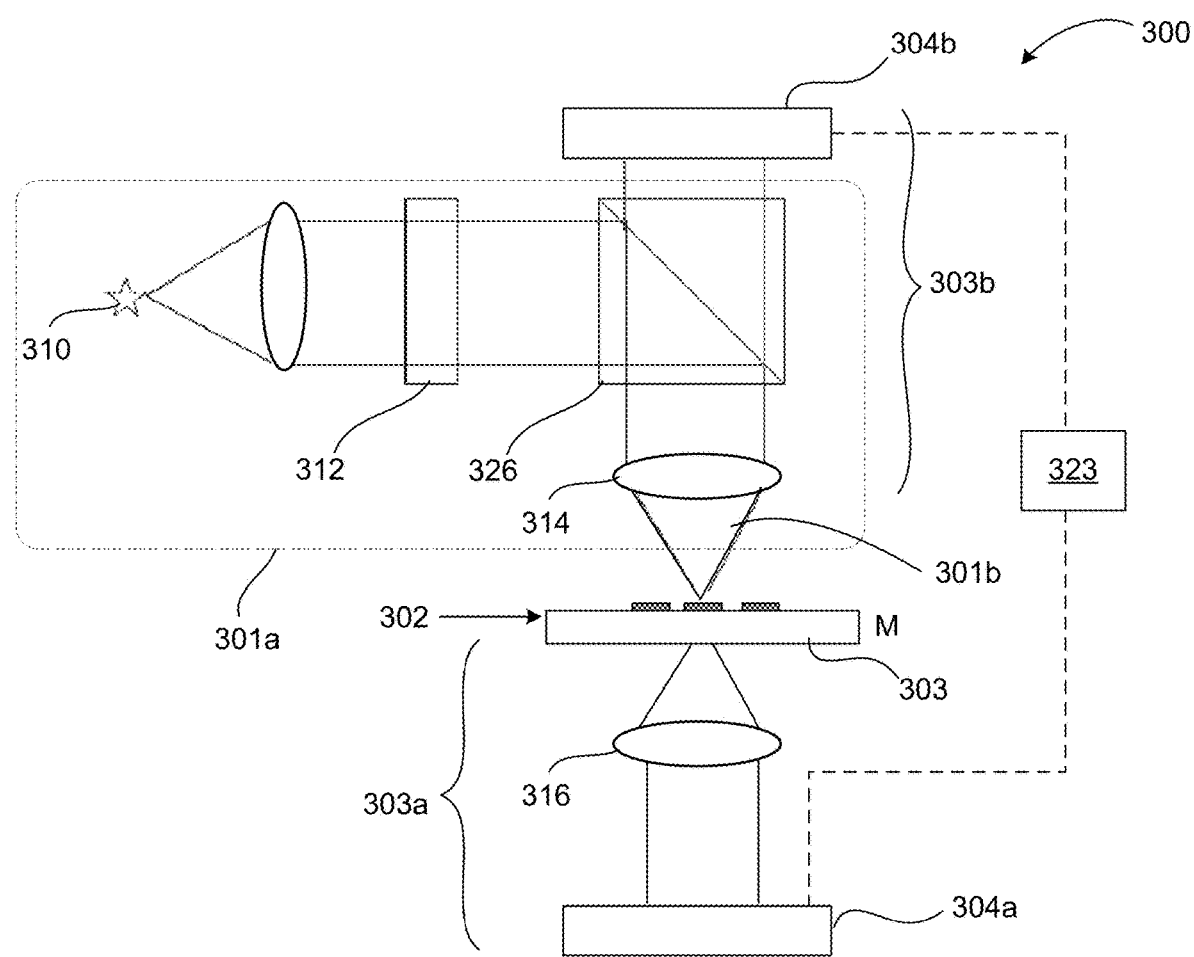
FIG. 3A is a diagrammatic representation of a beam profiling system 300 that is configured to determinate phase on a PSM in accordance with one embodiment of the present invention.

The phase determination techniques described herein may be implemented on various specially configured reflecting and transmissive systems. FIG. 3A is a diagrammatic representation of a beam profiling system 300 that is configured to determinate phase on a PSM in accordance with one embodiment of the present invention. Such phase determination techniques are further described below.

This system 300 generally includes illumination optics 301a for generating and directing an incident radiation beam towards a sample, such as photomask M located in the reticle plane 302. Specifically, system 300 includes a radiation source 310 for generating an incident beam of electromagnetic radiation that is directed through illumination optics 301a onto photomask M (303) in the reticle plane 302. For instance, the radiation source may be in the form of a lamp or laser for generating radiation in the visible, IR, UV, and/or x-ray light spectrum. In a phase determination mode, it is preferable to use a wavelength that is similar to the wavelength that is used by the photolithography system, such as less than 193 nm.

The photomask M to be inspected may be placed on a mask stage at the reticle plane 302 and exposed to the incident beam from the source 310. The illumination optics column may be moved relative to the mask stage and/or the stage moved relative to a detector or camera by any suitable mechanism so as to image/scan particular regions of the reticle. For example, a motor mechanism may be utilized to move the stage to each target portion that is to be imaged. The motor mechanism may be formed from a screw drive and stepper motor, linear drive with feedback position, or band actuator and stepper motor, by way of examples.

The illumination optics 301a may include any suitable elements for conditioning and shaping the incident beam. By way of examples, the illumination optics 301a may include components for setting numerical aperture (NA), spot size, polarization, or additional wavefront control (e.g., 312), such as polarizers, waveplates, apertures, spatial light modulators, etc. The system 300 may also include one or more beam splitters or mirrors (e.g., 326) for further directing the illumination beam, as well as an objective 314 for focusing the incident beam 301b on a target of sample M at reticle plane 302. The objective 314 may be configured to have a relatively high NA, such as greater than 0.8.

To achieve different spatial coherence and associated angles of incidence, the system 300 may include an illumination pupil filter (e.g., 312) for configuring different spatial portions of the illumination pupil to transmit or reflect illumination. In the illustrated example, the filter 312 may be adjusted so that the entire pupil is illuminated. If the illumination fills the pupil of the objective, σ equals 1. The parameter σ is a measure of the fraction of illumination aperture that is filled with light.

In response to the incident beam, an output beam is then reflected, transmitted, diffracted, and/or scattered from the target. In certain embodiments, the transmission and/or reflected collection side may be utilized for defect detection, determining various film or substrate characteristics, as well as determining relative phase of the photomask as further described below. As shown, the depicted system 300 includes transmission collection optics 303a and reflection collection optics 303b. The radiation that is transmitted through the mask M is directed through a collection of optical elements 303a onto a sensor 304a. On the reflecting side, optical elements (e.g., lens 314 and beam splitter 326) direct the reflected radiation onto sensor 304b. The collection optics 303a and 303b may include any components for conditioning, shaping, and projecting the corresponding output beam, such as tube lens, apertures, field stops, spatial light modulators, polarization optics (e.g. analyzers and waveplates), etc.

In the illustrated example, the radiation that is transmitted through the mask is collected by a detector array 304a so that each position on the array corresponds to a particular angle of incidence (AOI). Likewise, radiation that is reflected from the mask M can be collected by detector array 304b so that each position on the array corresponds to a particular AOI. Detector array 304a/b is generally positioned in the Fourier transform plane of the reticle surface. For example, each detector can be conjugate to the back pupil plane of the objective 316/314. Suitable sensors include charged coupled devices (CCD) arrays or cameras, time delay integration (TDI) sensor arrays or cameras, CMOS or NMOS sensor arrays, other two dimensional sensors, etc. In alternative embodiments, a single dimension CCD sensor, TDI sensor, or photomultiplier tube may be utilized for sequentially collecting multiple measurements for different parameters, such as different angles of incidence (AOI), one at a time. The system may include additional sensors, such as a spectrometer, etc. for other inspection/metrology purposes.

The signals captured by each sensor (e.g., 304a and/or 304b) can be processed by a computer system 323 or, more generally, by one or more signal processing devices, which may each include an analog-to-digital converter configured to convert analog signals from each sensor into digital signals for processing. The computer system 323 typically has one or more processors coupled to input/output ports, and one or more memories via appropriate buses or other communication mechanisms.

The computer system 323 may also include one or more input devices (e.g., a keyboard, mouse, joystick) for providing user input, such as changing focus and other recipe parameters. The computer system 323 may also be connected to the stage for controlling, for example, a sample position (e.g., focusing and scanning) and connected to other system components for controlling other parameters and configurations of such system components.

The computer system 323 may be configured (e.g., with programming instructions) to provide a user interface (e.g., a computer screen) for displaying resultant intensity values, images, phase values, and other inspection/metrology results. The computer system 323 may be configured to detect, calculate, and/or analyze intensity, phase, and/or other characteristics from reflected and/or transmitted sensed radiation beam. The computer system 323 may be configured (e.g., with programming instructions) to provide a user interface (e.g., on a computer screen) for displaying resultant intensity values, images, phase values, and other inspection/metrology characteristics. In certain embodiments, the computer system 323 is configured to carry out phase and amplitude determination techniques detailed herein.

Because such information and program instructions may be implemented on a specially configured computer system, such a system includes program instructions/computer code for performing various operations described herein that can be stored on a non-transitory computer readable media. Examples of machine-readable media include, but are not limited to, magnetic media such as hard disks, flash drive, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 3B:
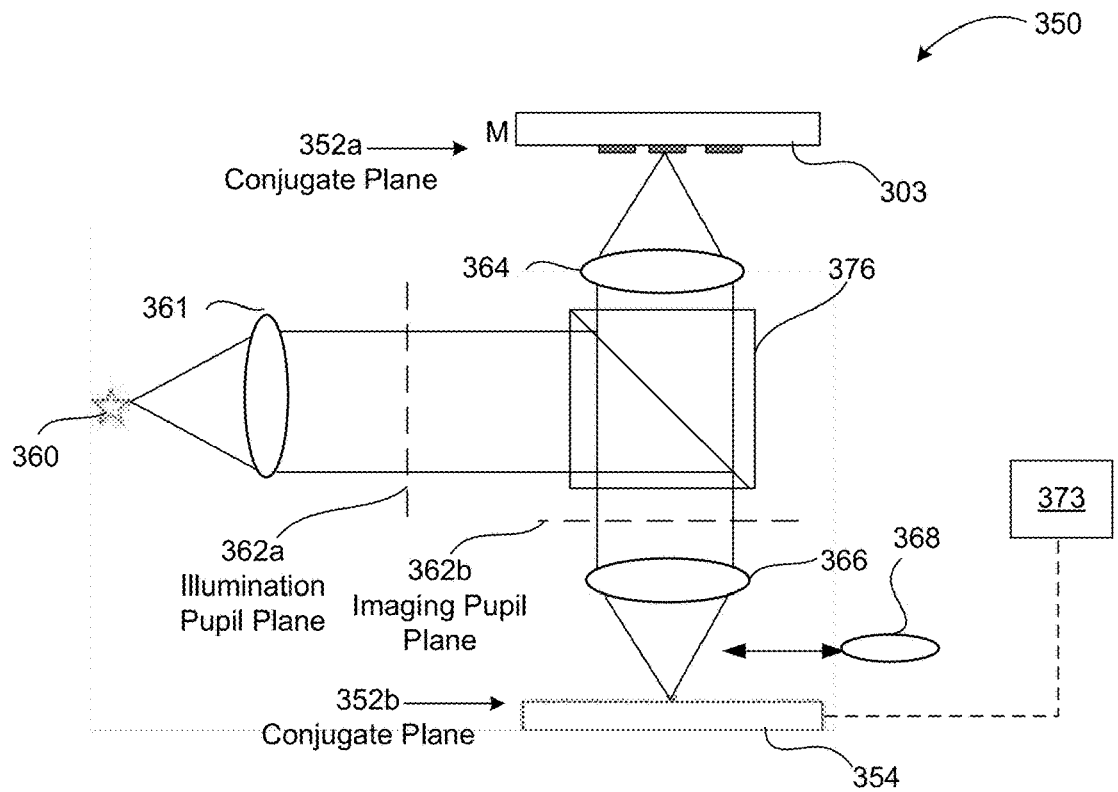
FIGS. 3B and 3C provide a schematic representation of a photomask inspection apparatus that is configured to implement phase determination techniques in accordance with an alternative embodiment of the present invention.
Figure 3C:
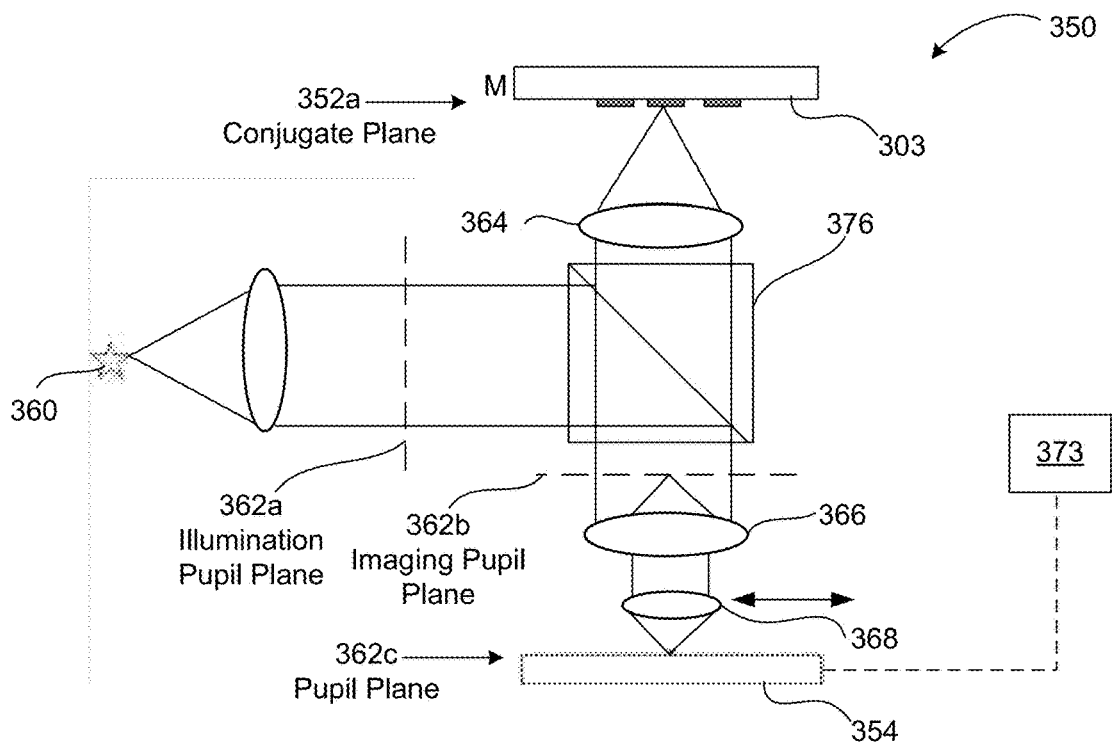

In certain embodiments, a reticle inspector system may be configured to determine phase. In a specific embodiment, a Bertrand lens is used to image the pupil of an inspection microscope. The Bertrand lens may be inserted into the system to relay the pupil plane to the sensor array. Without the Bertrand lens, the reticle plane is imaged onto the sensor array. FIGS. 3B and 3C provide a schematic representation of a photomask inspection apparatus 350 that is configured to implement phase determination techniques in accordance with an alternative embodiment of the present invention. This system 350 may include some components in common with the above-described system 300.

As shown, the system 350 includes a light source 360 for generating a monochromatic incident beam that is directed towards the mask M (303) by any suitable illumination components, such as lens 361, beam splitter 376, and objective lens 364.

In normal reflection mode, output light is reflected from the mask M, passes back through objective 364 and beam splitter 376 and then focused by tube lens 366 onto sensor array 354. In this mode, conjugate planes 352a and 352b are formed on the mask M and detector array 354, respectively. Additionally, the system 350 includes illumination pupil plane 362a, at which an aperture or other components are typically placed, and an associated imaging pupil 362b.

The system 350 includes a Bertrand lens 368 that is movable so it can be inserted into the output beam path. FIG. 3B illustrates normal reflection mode in which the Bertrand lens 368 is moved to a position that is outside the output beam path. In this mode, conjugate planes are formed at the mask (352a) and detector array (352b). In a phase mode, the Bertrand lens 368 is moved to a position that is in the output beam's path as shown in FIG. 3C. In this phase mode, the Bertrand lens 368 is positioned so as to cause a pupil plane image 362c to be formed on the detector array 354.

In certain embodiments, a system for inspecting or characterizing a photomask includes at least one memory and at least one processor that are configured to perform techniques described herein. One example of an inspection system includes a specially configured Teron® 6XX DUV inspection system available from KLA-Tencor of Milpitas, Calif., e.g., into which a Bertrand lens may be inserted.

For any of the embodiments described herein, any suitable inspection/metrology tool may be used to obtain photomask phase shift values via intensity measurements although use of an inspector tool simplifies the reticle assessment process. By way of other examples, one or more of the following tools may be used: a beam profile reflectometer (BPR) tool, etc. Any of these tools may include one or more incident and collection channels that are operable to cause at least one radiation beam to impinge on a reticle so as to obtain multiple reflected and/or transmitted measurements of targets for determination of phase values for such reticle. Additionally, a system that utilizes reflecting or refractive optics, such as for the objective, may be utilized.

Figure 4A:
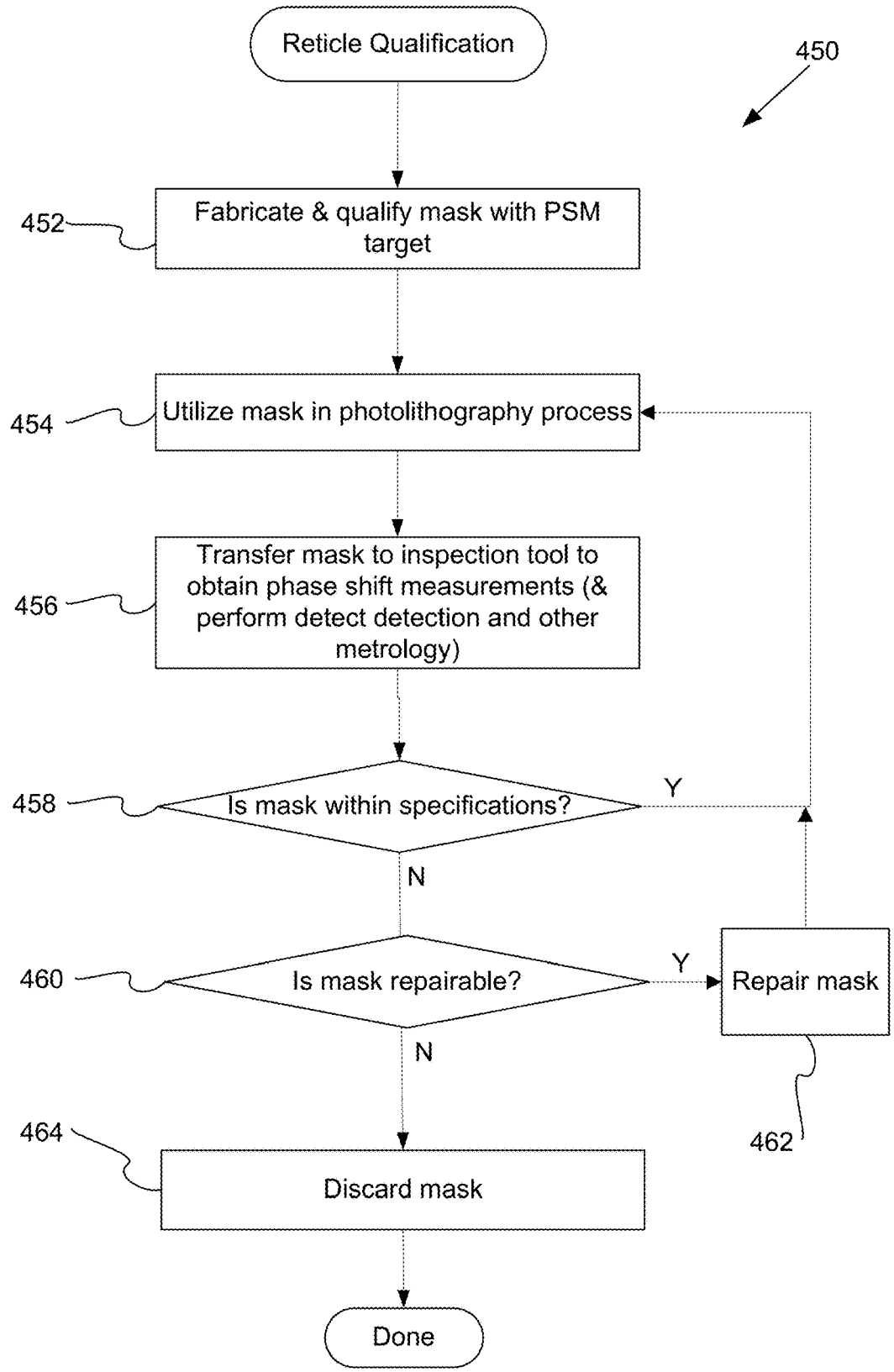
FIG. 4A is a flow chart illustrating a mask qualification process 450 in accordance with one embodiment of the present invention.

FIG. 4A is a flow chart illustrating a mask qualification process 450 in accordance with one embodiment of the present invention. Initially, a mask with at least one PSM target is fabricated and qualified in operation 452. The mask may be pre-qualified by any suitable technique prior to entry into the fabrication facility and again soon after. In general, the mask is verified to be free of defects and significant variation issues. During this pre-qualification, the phase-shift phase may also be measured on the newly fabricated mask as described further herein. The mask may then be used in a photolithography process to fabricate one or more wafers in operation 454.

At any suitable time or trigger, the mask may be transferred to an inspection tool in operation 456. For instance, the mask may be transferred to the defect inspection tool for defect detection after a specified number of wafers are fabricated or after a specified period of time. In another example, phase-shift measurements may be triggered after cleaning. Phase-shift measurements may be obtained from the mask phase-shift target in operation 456. Other inspections and/or metrology process, such as defect detection and CD measurements, may also be performed while the mask in still in the inspection tool. In specific embodiments, the phase-shift measurements are performed immediately prior to or after defect inspection is performed.

It may then be determined whether the mask is within specifications in operation 458. For instance, the mask may be deemed to not be within specifications if any significant defects are found. Defects may be found by die-to-die, cell-to-cell, or die-to-database comparisons of structures, and any resulting differences are characterized as real defects if they are above a predetermined threshold.

If the mask is within specifications, the mask may continue to be used in operation 454 until it is again inspected and measured. If the mask is determined to not be within specifications, it may then be determined whether the mask is repairable in operation 460. If the mask is repairable, it may then be repaired in operation 462. For instance, material may be added or removed from the mask. A cleaning process may also be performed to remove particle defects. It is noted that phase-shift measurements would also be preferably performed after the cleaning process. Otherwise, if the mask is not repairable, the mask may be discarded in operation 464.

Figure 4B:
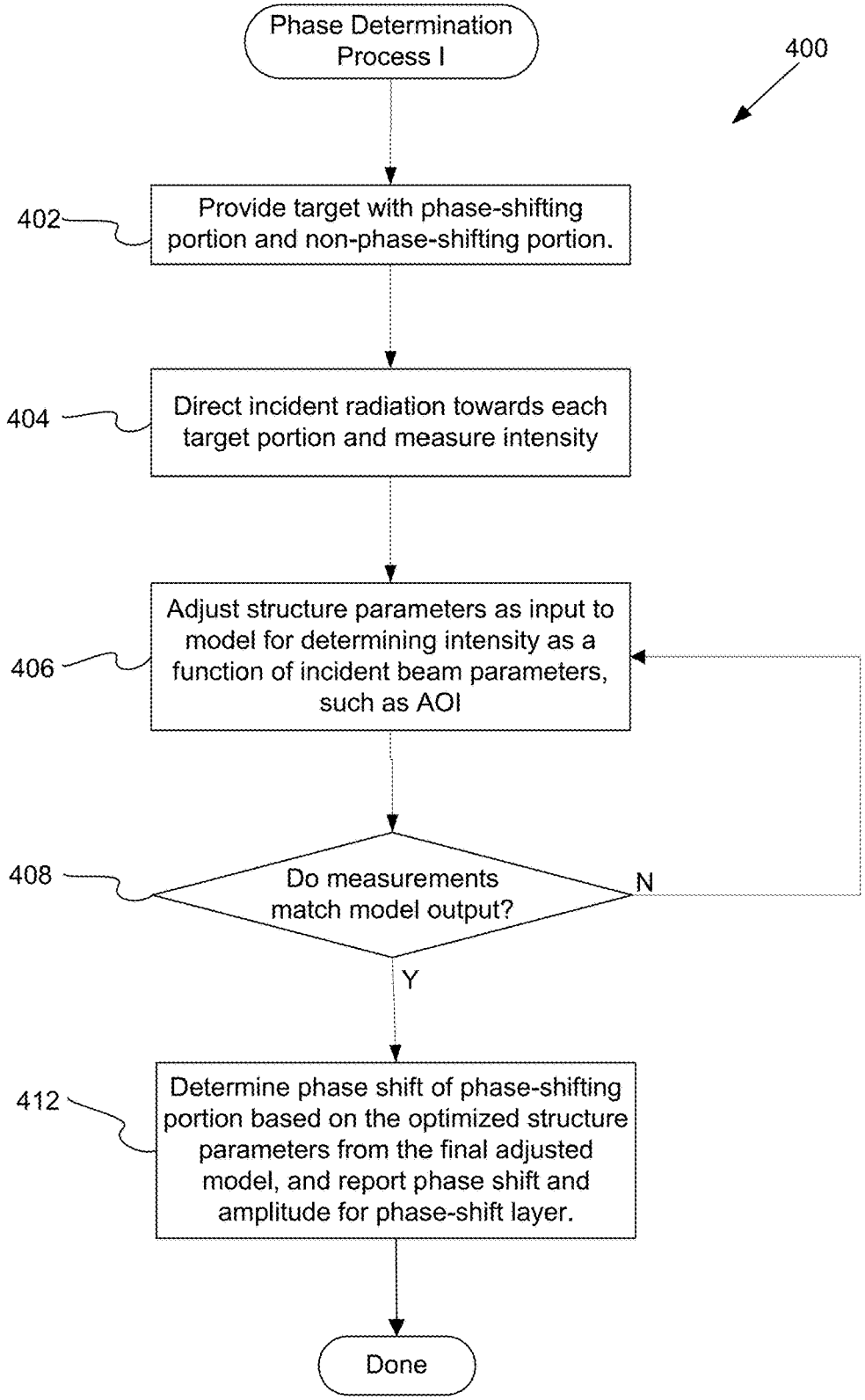
FIG. 4B is a flow chart illustrating a process for determining phase and amplitude for a reticle in accordance with a first embodiment of the present invention.

FIG. 4B is a flow chart illustrating a process 400 for determining phase and amplitude for a reticle in accordance with a first embodiment of the present invention. Initially, a target having a phase-shifting portion and a non-phase-shifting portion is provided in operation 402. For instance, a target may take the form of the target 120 of FIG. 1, which includes phase-shift portion 122a and non-phase-shift portion 122b.

In another example, the target may have a phase-shift portion in the form of the substrate recess 204 of FIG. 2 and a non-phase-shift portion in the form of the non-recessed substrate portion 208. The term "phase-shift" refers to a target region that has a relative phase shift, as compared to a "non-phase-shift" target portion. In the example of FIG. 2, the non-recessed substrate region 208 will differ in phase from the substrate recess 204. In alternative examples, a target for determining relative phase on a mask may take the form of a plateau and a non-plateau portion, a plateau and recess portion, different plateau portions with different heights, different recess portions with different depths, or any combination thereof.

After a target for determining phase is provided, incident radiation may then be directed towards each target portion and intensity is then measured in operation 404. For instance, each target portion 122a and 122b of FIG. 1B may be illuminated, one at a time, by an inspection system's radiation source, e.g., 360 of system 350 or some other type of tool, and output radiation that is transmitted through and reflected from each target portion 122a and 122b may be collected by such inspection system's detector array 354. The measurements may be obtained as a function of angle of incidence (AOI) or multiple measurements may be made with different illumination configurations, for each target portion.

In general, reflection and transmission radiation undergoes multiple reflections within each target portion's film stack (or with respect to substrate and air interfaces), and such reflection and transmission exhibits interference effects. In one implementation, reflected and transmitted intensities are available at all angles allowed by the numerical aperture of the objective. That is, the illumination filter 362 is set to result in illumination filling the pupil of the objective pupil (σ equals 1). Different angles of reflection or transmission map to different places in the pupil of the objective. For instance, the intensities for the phase-shift target portion (e.g., 122a) are measured relative to their counterparts on the non-phase-shifting target portion (e.g., 122b).

The reflected and transmitted fields of an idealized planar structure can be calculated exactly, for example, as described in J. E. Sipe, "New Green-function formalism for surface optics", J. Opt. Soc. Am. B, vol. 4, no. 4, p. 481, April 1987, which article is incorporated herein by reference for determining reflected and transmitted intensities for a planar structure. The relative intensities for the phase-shifting and non-phase-shifting target portions may be computed using a calculation, which is similar to techniques described in the above-referenced article by Sipe, for a given set of parameters of the film stack. For the illustrated film stack 122a of FIG. 1, the parameters for input for the model would include each layer thicknesses $h_1$ and $h_2$, the refractive index of the $SiO_2$ layer 128, and the complex refractive index of the attenuating phase-shift layer 126.

Referring back to the illustrated process, one or more structure parameters of a film stack may be adjusted as input to a model for determining intensity as a function of the incident beam's parameters, such as AOI, etc., in operation 408. It may then be determined whether the measurements match the model output in operation 406. The parameters of the model may be repeatedly varied until there is a close match based on any suitable criteria or measurement of matching/closeness, e.g., the sum of the squared differences between predicted and measured intensities is minimized. The search for optimal parameters for the film stack may be conducted using a quasi-Newton algorithm or other algorithms, such as Gauss-Newton, conjugate gradients, steepest descent, Levenberg-Marquardt, simulated annealing, and/or genetic algorithms.

Once the optimization is completed, the phase shift of the transmitted field of phase-shifting target portion may then be computed using the optimized structure parameters from the final adjusted model in operation 412. For instance, the phase may be determined using a model for electromagnetic wave theory as described in the above-reference Sipe reference, which includes simulation of the incidence light being transmitted through a structure having the determined structural parameter values, e.g., $h_1$, $h_2$, and the refractive indexes for the film stack target portion, as compared to the non-phase-shift portion, to result in a phase shift value for the mask. The phase shift and amplitude values for the film stack may also be reported and stored in operation 412. The process may then end.

Although it is not necessary to measure both reflected (R) and transmissive (T) radiation in the film-stack embodiment, measuring both R and T light provides some benefit. Both R and T depend on AOI, film material, and film thickness. Therefore, R and T measurements facilitate the determination of film optical properties and thickness. In cases in which light is not excessively attenuated upon round trip propagation through the film, R contains information about the film thickness and its optical properties. In cases in which light is excessively attenuated upon round trip propagation through the film, R only contains information about the optical properties of the film material. On bare substrate (fused silica) R is about 4%, not zero, and the optical properties of the substrate are well known. Thus, the 4% measurement from the substrate can be used to calibrate the R measurement on the film.

Figure 5A:
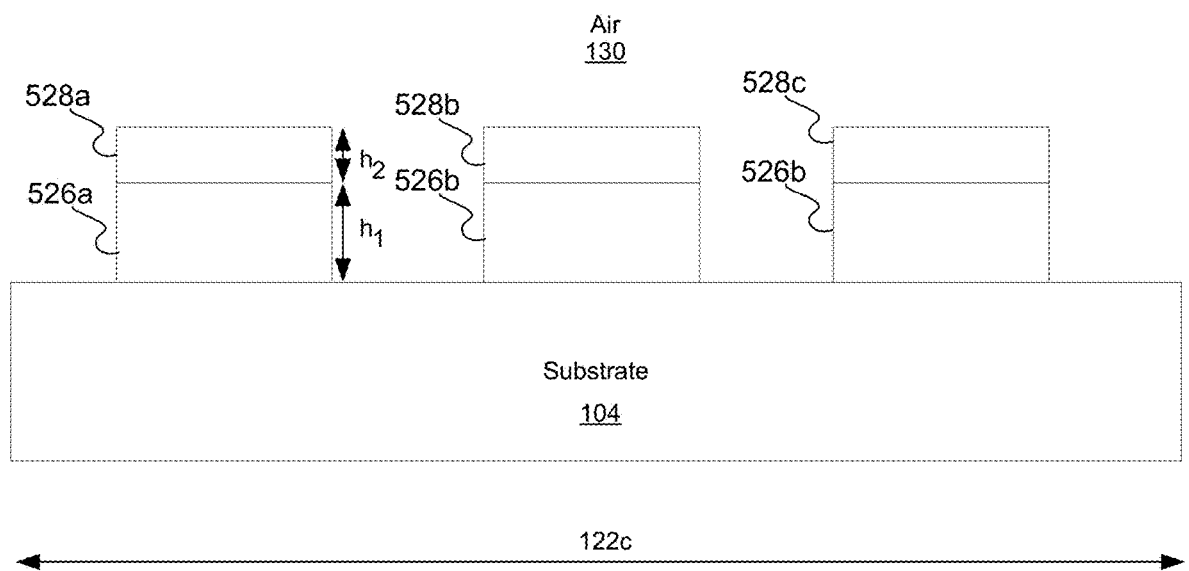
FIG. 5A is a diagrammatic representation of a periodic target portion, which may be measured in conjunction with film stack and substrate portions in accordance with a second embodiment of the present invention.

In a second embodiment, each metrology target may include at least three parts: an area where the phase-shift layer is removed (122a); an area where the phase-shift layer is intact (122b); and an area where a periodic pattern (an array pattern) is etched into the layer. FIG. 5A is a diagrammatic representation of a periodic target portion 122c, which may be measured in conjunction with the phase-shift film stack and bare substrate portions (e.g., FIG. 1) in accordance with a second embodiment of the present invention. Alternatively, the target may have only a grating and a bare substrate portion. Each part of the metrology target is larger than the field illuminated on the mask and completely contains the illuminated field. For example, the extent of each part may be 200 μm×200 μm.

In a preferred embodiment, the array pattern is a line grating as shown in FIG. 5A. Other array patterns and shapes, such as an array of holes or posts, may alternatively be used. Multiple arrays with the same or different structural parameters (e.g., different pitches, duty cycles, or dimensions) may also be used to improve accuracy of the phase measurements. For instance, two or three gratings may be used. The array may also be a two-dimensional array of holes or pillars or other shapes etched in a phase-shifting material.

As shown, the grating portion may comprise a plurality of line portions having attenuation/phase-shift layer portions 526a-c and oxidation/passivation layer portions 528a-c formed over transparent substrate 104. Similar to the other target portions, air 130 may also be present and accounted for in the optical model.

In this second embodiment, the mask may be generally illuminated by substantially monochromatic light and, more specifically, so as to measure the phase shift at the same monochromatic wavelength of the photolithography system. The fractional bandwidth of illumination may, for example, be smaller than one percent. In a preferred embodiment, the spatial coherence of illumination that is directed towards the grating target portion is high, for example, $\sigma \le 0.25$.

In alternative embodiments, $\sigma$ can be set to any suitable number, such as equal to 1 like the first embodiment. Additionally, different illumination configuration may be implemented for the different target portions. In one example, monochromatic radiation is directed at all target portions, while using different spatial coherence values for the grating ($\sigma \le 0.25$) vs. the film stack/substrate target portions ($\sigma = 1$).

Figure 5B:
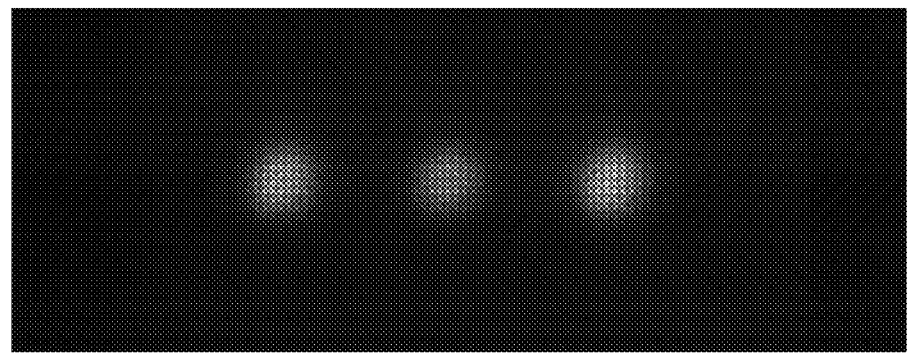
FIG. 5B shows an example of the image collected in the pupil plane from a grating target portion that is in the form of a line grating etched in a MoSi film on a silica substrate.

FIG. 5B shows an example of the image collected in the pupil plane from a grating target portion that is in the form of a line grating etched in a MoSi film on a silica substrate. In this example, the duty cycle of the grating is 50% and the pitch p is 320 nm in mask scale (80 nm in wafer scale in 4× reduction lithography). The spot in the center is the $0^{th}$ diffraction order, while the two side lobes are the intensities from the $+1^{st}$ and $-1^{st}$ diffraction orders. In sum, diffraction orders $-1$, $0$, $+1$ may be imaged in the pupil plane for a phase-shifting grating target. Two or more gratings may also be measured to improve results.

Figure 6:
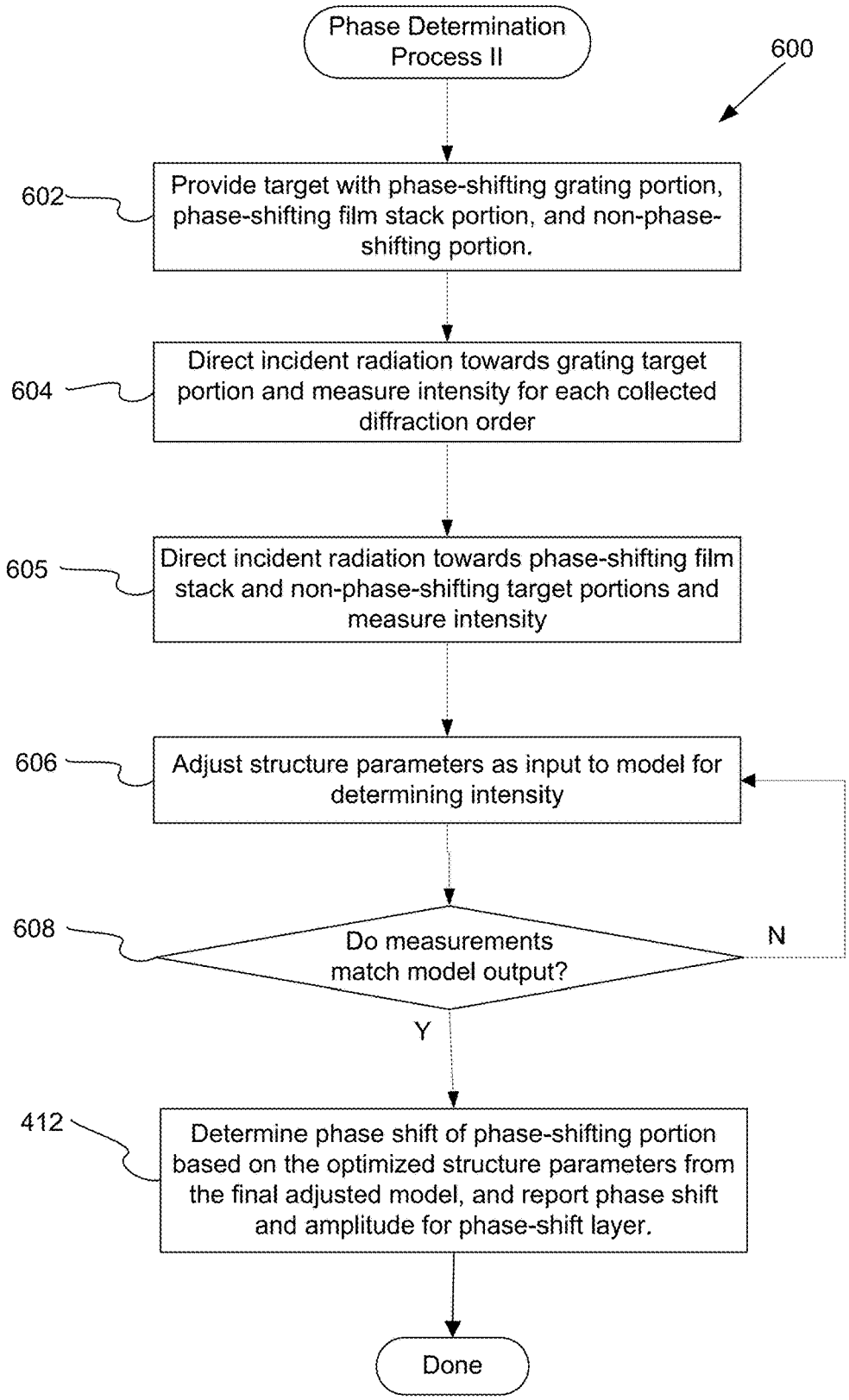
FIG. 6 is a flow chart illustrating a procedure for determining phase and amplitude in accordance with a second embodiment of the present invention.

FIG. 6 is a flow chart illustrating a procedure 600 for determining phase and amplitude in accordance with a second embodiment of the present invention. In this example, a phase-shifting grating portion (e.g., 122c), a phase-shifting layer portion (e.g., 122a), and a non-phase-shifting target portion, such as a bare substrate (e.g., 122b), are provided in operation 602.

Incident radiation may then be directed towards the grating target portion and intensity measured from each collected diffraction order in operation 604. In one embodiment, the grating and pupil filter are adjusted and sized to result in the 0, $+1^{st}$, and $-1^{st}$ orders of diffraction being imaged on the sensor. The system and grating may be arranged or set up to image more diffraction orders, e.g., $+2^{nd}$ and $-2^{nd}$ orders. In one aspect, the grating target is larger than the illumination field so that the grating target completely contains such field, and the illumination spatial coherence is relatively small. By way of example, the grating 200 µm×200 µm. The grating pitch is selected so that light that is scattered from the structures for one or more selected orders do not overlap and fall within the imaging pupil of the metrology system. The grating pitch P may also be selected such that $\lambda/P$ plus the illumination NA is less than or equal to the NA of the image pupil. The illumination filter (e.g., 362) may also be set to result in $\sigma$ that is less than or equal to 0.25.

In one embodiment, the grating is not measured as a function of AOI. Intensities at all diffraction orders, measured at several different AOI (e.g., up to 7 AOI), are simultaneously measured and calculated as a function of parameters that pertain to the grating. Such grating parameters are tuned so that all the total of squared differences between all intensity values is minimized, in one specific embodiment.

In this embodiment, incident radiation is also directed towards the phase-shifting film stack and non-phase-shifting target portions and intensity is measured in operation 605. Intensity measurements may also be obtained as a function of angle of incidence (AOI) for each target portion. In sum, intensity measurements may be obtained for each target type (e.g., each grating if more than one), each AOI, and each diffraction order.

In this embodiment, it is possible to measure the phase of transmission, $\phi$, because the intensities depend both on the magnitude $|T|$ and phase $\phi$ of the transmission. Although not the preferred technique, this relationship can be illustrated in a simple manner via the Kirchhoff approximation, in which the complex amplitudes of the diffraction orders of a line grating are:

$$a_0 = 1 + (|T|e^{i\phi} - 1)\frac{w}{p} \qquad \text{Equation\_2}$$
$$a_1 = (|T|e^{i\phi} - 1)\frac{1}{\pi}\sin\!\left(\frac{\pi w}{p}\right)$$

where w is the grating line width and p is the grating pitch. T is the amplitude of transmission through the film stack under test and is a complex number. $|T|$ is the magnitude and $\phi$ is the phase (angle) of the complex T value. In a more accurate embodiment, the diffraction order intensities, $|a_0|^2$ and $|a_1|^2$, may be calculated by solving Maxwell's equations by more accurate and sophisticated methods, such as Rigorous Coupled Wave Analysis (RCWA). In a specific example, the Positive Resist Optical Lithography (PROLITH) simulation software available from KLA-Tencor Corporation, Milpitas, Calif. (USA) may be used. In general Maxwell's equations can be solved by using any suitable technique such as the following: Finite-Difference Time-Domain (FDTD), Finite Elements Method (FEM), boundary integral methods, or spectral element methods. In these techniques, the phase shift 4) does not enter the model directly, but is calculated after determining the optimized structure parameters of the targets from the measured intensities.

Similar to the first film-stack-only embodiment, structure parameters may be adjusted as input to a model for determining intensity through a grating and film stack in operation 606 and it may then be determined whether the measurements match the model output in operation 608. The parameters may generally be adjusted and optimized by minimizing the difference between measured and computed intensity values simultaneously for all angles of incidence and diffraction orders. The parameters continue to be adjusted until the model results match the measurements using any suitable measure of closeness, after which the phase shift may then be determined and reported (along with the amplitude for the phase-shifting layer) based on the optimized structure parameters from the adjusted model in operation 412 as described above. However, the phase results that are determined from the grating and film stack may also be averaged together. Similarly, if more than one grating is used, their respective phase values may be averaged together. It may also be determined whether mask is defective, repairable, or usable based on such phase shift determination in operation 414 as described above.

In general, a mathematical model may be provided for calculating the intensities in the pupil for the cases of transmitted and reflected radiation from the uniform film and grating target portions. The mathematical model has adjustable parameters: thickness parameters $h_1$ and $h_2$, the grating line width w, and the complex refractive index of the attenuating phase-shift layer. The adjustable parameters of the model are selected such that the sum of squared differences of the calculated and measured diffraction orders is minimized. The sum is taken over reflection and transmission modes, and over target portions (uniform film, grating of the first pitch, grating of the second pitch, etc.). The minimization or optimization of the structure parameters may be performed by a quasi-Newton or Levenberg-Marquardt algorithm. After the optimal parameters are obtained, the phase is determined by calculating the fields transmitted through the film stack having the optimized thicknesses $h_1$ and $h_2$ as determined from the final model.

Certain embodiments of the present invention allow the number of tools and the cycle time to be reduced by enabling the reticle inspection tool to also be used to measure phase shift, in addition to defect detection and measurement of other characteristics. Less contamination also occurs since the mask does not need to be moved as much from tool-to-tool. Minimization of contamination is a desired goal since the cleaning process to remove contamination can also cause an undesirable phase shift in the mask's PSM regions. In fact, cleaning can also alter the phase shift of a mask. Since there are numerous sources that cause phase shift in the mask, it is beneficial to provide techniques for determining phase shift of the mask in the inspection tool that is already closely integrated and used within the inspection flow for the photolithography system.

The present invention is not limited by the structures described above. Structures included in a target may be organized in various configurations and shapes, including, for example, lines, grids, rectangles, squares, curved lines, curved shapes, circles, cylindrical shapes, conical shapes or combinations of the foregoing. Such configurations of structures may be disposed at various locations within the target, and may describe various angles with respect to the electromagnetic radiation incident on the target. For example, the sets of structures could be organized as a set of parallel lines perpendicular to the direction of propagation of a collimated set of radiation rays or of a beam incident on the target. In another case, the structures organized as a set of parallel lines could be disposed at an acute angle with respect to the incident radiation, possibly at an angle of 45 degrees. Alternatively, the incident radiation could be directed to be substantially parallel to at least some of the parallel lines comprising the structures or defining the structures.

In any of the above described embodiments, it may then be determined whether the measured or determined phase shift or other parameter is out of specification. If the parameter is not significant (more than the predetermined value), it may be determined that the target is within specification.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of determining a phase shift of a photomask having a phase-shift target, comprising
using an inspection or metrology system, directing an incident beam towards the target comprising a first portion formed from a phase-shifting layer deposited over a substrate and a second portion from which the phase shifting layer is removed, wherein the incident beam is directed towards each of the first and second portions of the target;
using the inspection or metrology system, measuring a plurality of first intensity values that are transmitted through each of the first and second portions of the target in response to the incident beam, wherein the first intensity values are measured at one or more detectors onto which a pupil plane of the inspection or metrology system is relayed;
determining and storing a phase shift value for the target based on the measurements of the first intensity values from each of the first and second portions of the target;
using the inspection or metrology system, measuring a plurality of second intensity values that are transmitted through the photomask in response to the incident beam, wherein the second intensity values are measured at the one or more detectors onto which a photomask plane is imaged; and
detecting defects based on the measurements of the second intensity values.

2. The method of claim 1, wherein the first and second portions of the target each have a size for completely filling the illumination field of the incident beam when such incident beam is directed at each of the first and second portions.

3. The method of claim 2, wherein the target further comprises a third portion comprised of one or more gratings etched in the phase-shifting layer and the first intensity values are further obtained for each imaged diffraction order.

4. The method of claim 3, wherein the third portion comprises two or more gratings.

5. The method of claim 3, wherein the one or more grating are formed from a plurality of lines etched from the phase-shifting layer.

6. The method of claim 3, wherein the one or more grating are formed from a two dimensional array of holes or pillars etched from the phase-shifting layer.

7. The method of claim 1, further comprising:
measuring a plurality of first reflected intensity values that are reflected from the target in response to the incident beam, wherein the phase shift value is further based on the first reflected intensity values; and
measuring a plurality of second reflected intensity values that are reflected from the photomask in response to the incident beam, wherein the operation of detecting defects is further based on the second reflected intensity values.

8. The method of claim 1, wherein the first intensity values are obtained from a pupil image at the pupil plane using a Bertrand lens, which is inserted into a path of an output beam transmitted through the target in response to the incident beam during the operation of measuring the first intensity values and removed from the output beam during the operation of measuring the second intensity values.

9. The method of claim 8, wherein the inspection or metrology system is a reticle inspection system.

10. The method of claim 9, wherein the reticle inspection system comprises an objective from which the first intensity values are obtained from a pupil image at the pupil plane of the objective.

11. The method of claim 10, wherein the objective is a reflective or refractive element.

12. The method of claim 1, wherein the phase shift is determined by adjusting a plurality of parameters of a model for calculating intensity values until a difference between such calculated intensity values and the first intensity values is minimized, and then using the model to determine the phase shift based on final values for the model parameters.

13. A system for determining a phase shift of a photomask having a phase-shift target comprising a first portion formed from a phase-shifting layer deposited over a substrate and a second portion from which the phase shifting layer is removed, the system comprising:
   illumination optics for directing an incident beam towards the photomask and each of the first and second portions of the target;
   collection optics having one or more detectors for measuring a plurality of first intensity values that are transmitted through each of the first and second portions of the target and measuring a second plurality of intensity values that are transmitted through the photomask in response to the incident beam; and
   a controller configured to:
      determine and store a phase shift value for the target based on the first intensity values, wherein the first intensity values are measured at the one or more detectors onto which a pupil plane of the system is relayed, and
      detect defects based on the measurements of the second intensity values, wherein the second intensity values are measured at the one or more detectors onto which a photomask plane is imaged.

14. The system of claim 13, wherein the first and second portions of the target each have a size for completely filling the illumination field of the incident beam when such incident beam is directed at each of the first and second portions.

15. The system of claim 14, wherein the target further comprises a third portion comprised of one or more gratings etched in the phase-shifting layer and the first intensity values are further obtained for each imaged diffraction order.

16. The system of claim 15, wherein the third portion comprises two or more gratings.

17. The system of claim 15, wherein the one or more grating are formed from a plurality of lines etched from the phase-shifting layer.

18. The system of claim 15, wherein the one or more grating are formed from a two dimensional array of holes or pillars etched from the phase-shifting layer.

19. The system of claim 13, wherein the controller is further configured for causing the following operations:
   measuring a plurality of first reflected intensity values that are reflected from the target in response to the incident beam, wherein the phase shift value is further based on the reflected intensity values; and
   measuring a plurality of second reflected intensity values that are reflected from the photomask in response to the incident beam, wherein the operation of detecting defects is further based on the second reflected intensity values.

20. The system of claim 13, further comprising a Bertrand lens, wherein the first intensity values are obtained from a pupil image at the pupil plane using the Bertrand lens, which is inserted into a path of an output beam transmitted through the target in response to the incident beam during the operation of measuring the first intensity values and removed from the output beam during the operation of measuring the second intensity values.

21. The system of claim 20, wherein the system is in the form of a reticle inspection system.

22. The system of claim 21, further comprising an objective from which the first intensity values are obtained from a pupil image at the pupil plane of the objective.

23. The system of claim 22, wherein the objective is a reflective or refractive element.

24. The system of claim 13, wherein the phase shift is determined by adjusting a plurality of parameters of a model for calculating intensity values until a difference between such calculated intensity values and the first intensity values is minimized, and then using the model to determine the phase shift based on final values for the model parameters.

\* \* \* \* \*